United States Patent [19]

Hanson

[11] Patent Number: 4,633,350
[45] Date of Patent: Dec. 30, 1986

[54] INFORMATION STORAGE SYSTEM WITH READILY REMOVABLE HIGH CAPACITY DISK DRIVE UNIT

[75] Inventor: George E. Hanson, Cedar Rapids, Iowa

[73] Assignee: Norand Corporation, Cedar Rapids, Iowa

[21] Appl. No.: 571,389

[22] Filed: Jan. 17, 1984

[51] Int. Cl.[4] .................. G11B 5/012; G11B 33/02
[52] U.S. Cl. .................... 360/98; 369/75.1; 369/36; 360/86
[58] Field of Search ............... 369/36, 38, 75.1; 339/75 R, 75 M; 360/98, 86, 88, 97, 99, 133, 94

[56] References Cited

U.S. PATENT DOCUMENTS

| | | | |
|---|---|---|---|
| 3,487,390 | 12/1969 | Klinger et al. | 360/98 |
| 3,786,454 | 1/1974 | Lissner et al. | 360/133 |
| 3,843,967 | 10/1974 | Mulvany | 360/98 |
| 4,170,030 | 10/1979 | Castrodale et al. | 369/38 |
| 4,453,188 | 6/1984 | Johnson et al. | 360/86 |

FOREIGN PATENT DOCUMENTS

| | | |
|---|---|---|
| 0011025 | 5/1980 | European Pat. Off. . |
| 808848 | 2/1959 | United Kingdom . |
| 1452535 | 10/1976 | United Kingdom . |
| 2088617 | 6/1982 | United Kingdom . |

Primary Examiner—John H. Wolff
Assistant Examiner—Andrew L. Sniezek
Attorney, Agent, or Firm—Neuman, Williams, Anderson & Olson

[57] ABSTRACT

A computer system providing for quick removal and quick and simple installation of a disk drive unit into the system. A latching and positioning arrangement provides releasable support for the disk drive unit and achieves automatic electrical connections with the installation of the disk drive unit in the computer system.

6 Claims, 7 Drawing Figures

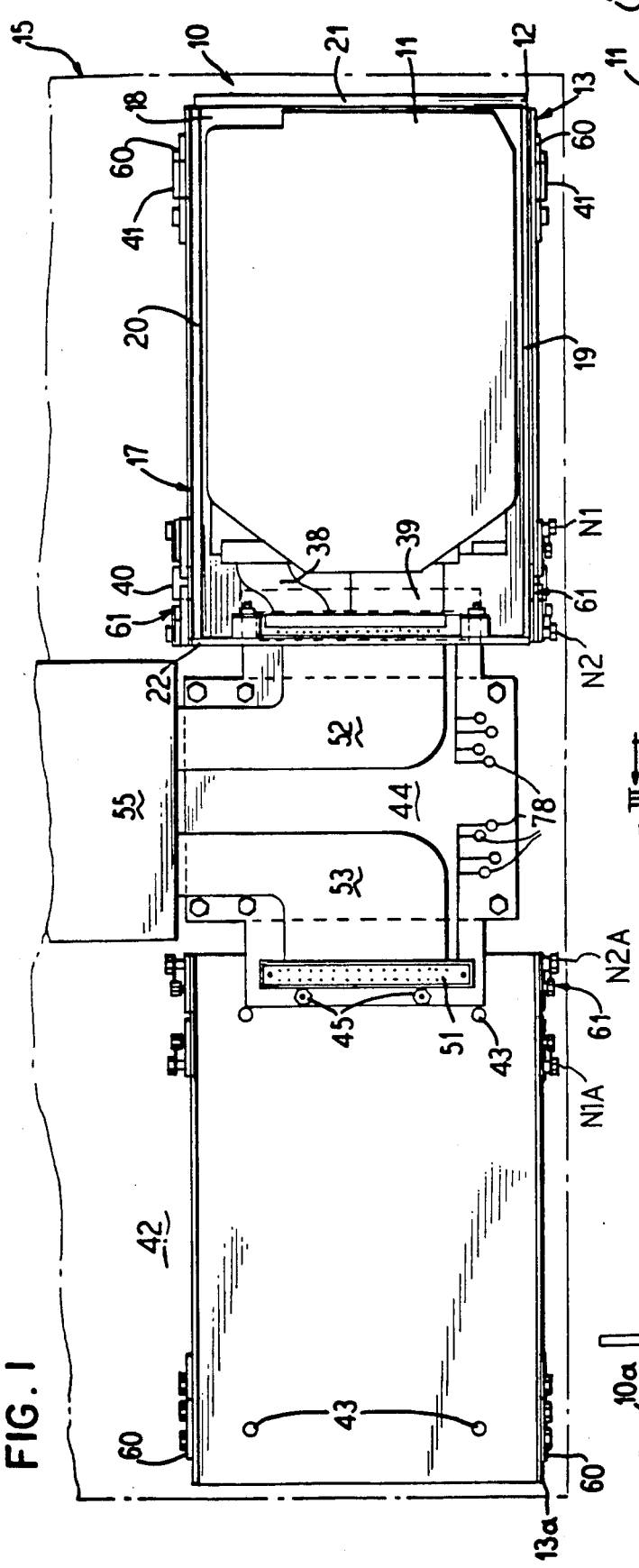
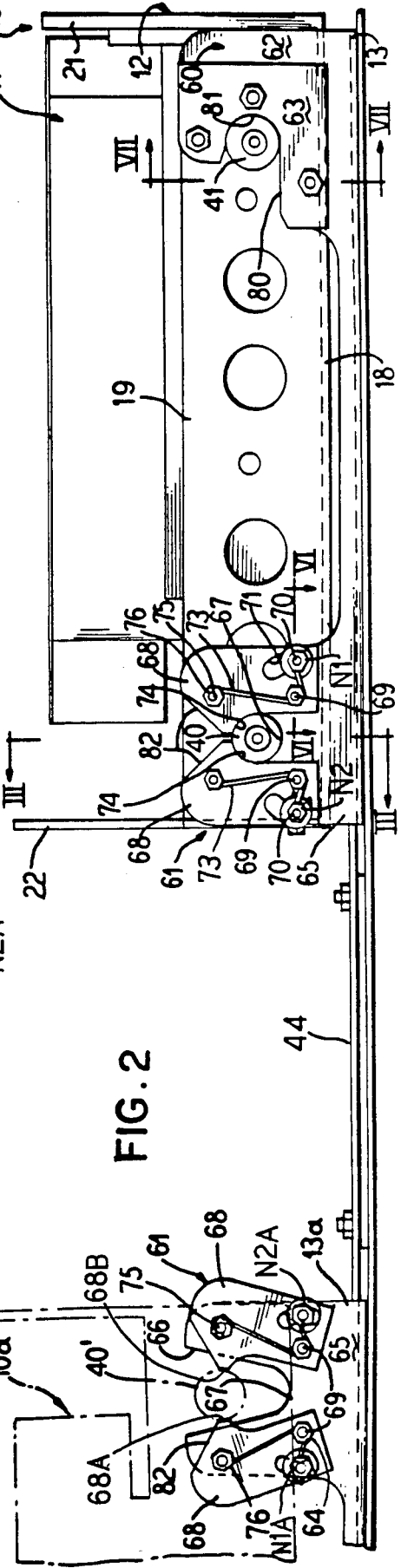

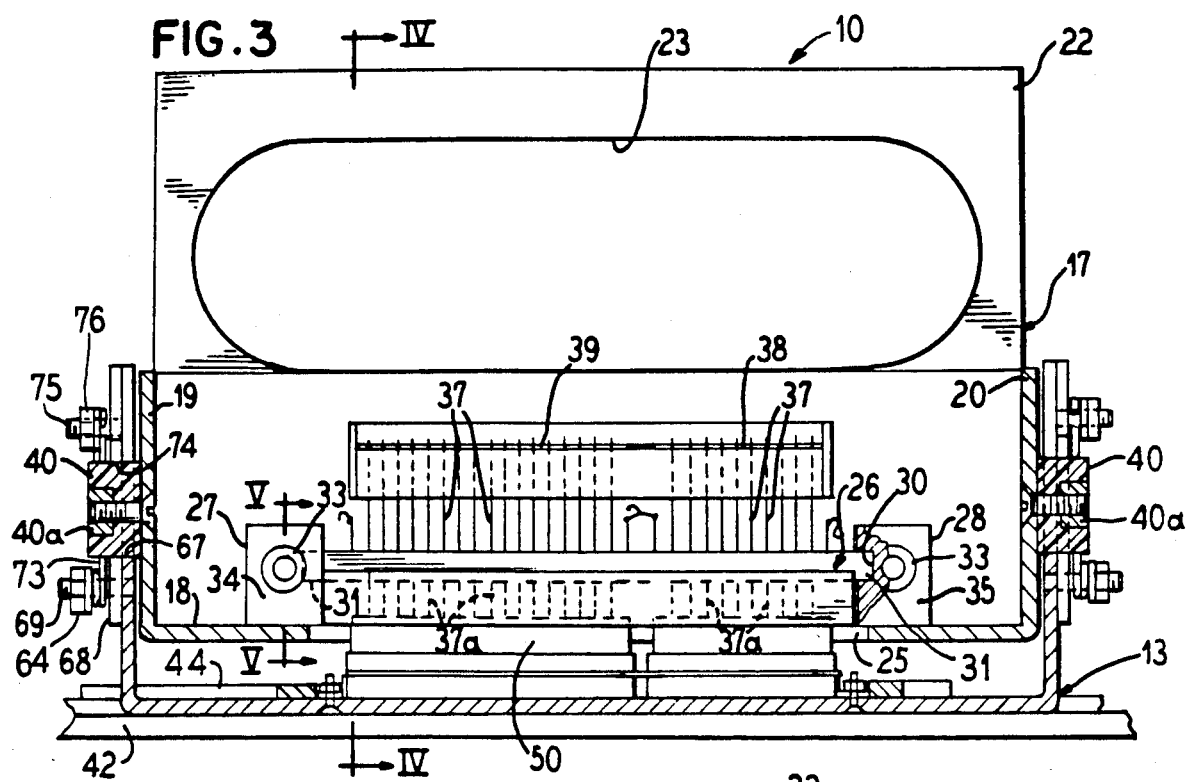
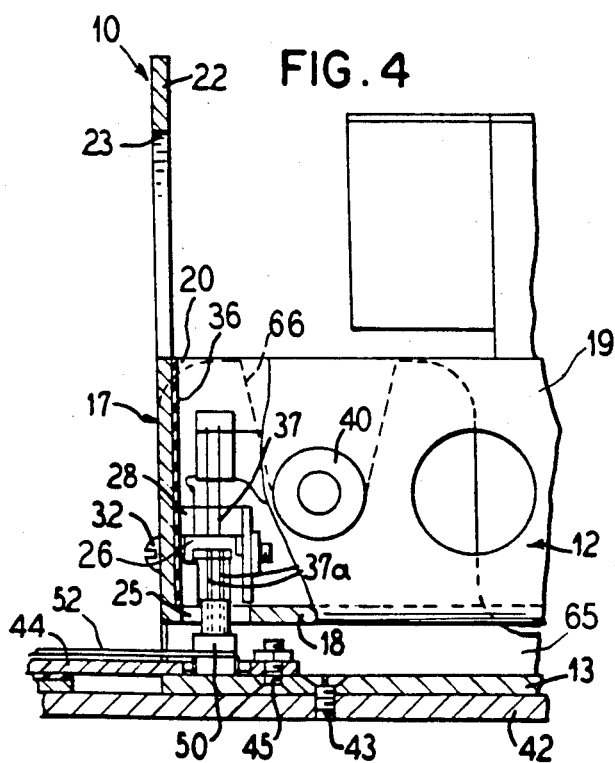
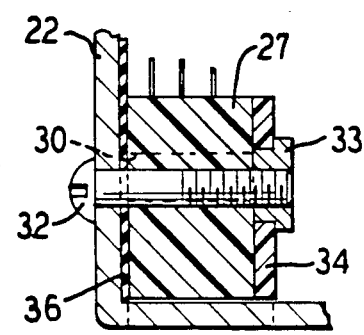
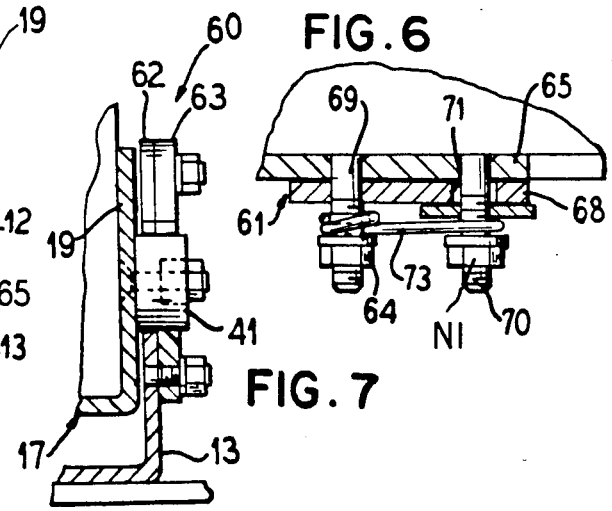

INFORMATION STORAGE SYSTEM WITH READILY REMOVABLE HIGH CAPACITY DISK DRIVE UNIT

BACKGROUND OF THE INVENTION

1. Field of the Invention

This invention relates to an apparatus which permits quick removal of high capacity disk drive units from a supporting base unit of a host computer system. The apparatus further provides quick, simple installation of the disk drive units into the computer system.

2. SUMMARY OF THE INVENTION

The present invention is directed to a disk drive module which is quick and simple to remove from a host computer system and which can be quickly and accurately reinstalled in the system. A quick release hold down arrangement for the disk drive module eliminates all manual insertions or extractions of connecting cables and automatically insures accurate positioning of the electrical connectors during final assembly of thedisk dirve module into the host computer system. This hold down and positioning arrangement provided support for two disk drive modules.

Each module includes a carrier assembly to which a disk drive unit is mounted and having an electrical connector member secured directly above and aligned with an elongated aperture formed at one end of the carrier. Ribbon cables interconnect the disk dive unit with the electrical connector.

The carrier assemblies are mounted in the computer system on fixed base units located at opposed ends of an interconnect board. The interconnect board serves to accurately support a pair of spaced electrical connector fittings which are connected to various computer system components in order to establish the desired power, data and control signal transmission paths are required. Each of the fixed base units includes a pair of guiding and retaining brackets remote from the connector fittings and a pair of latching assemblies adjacent the connector fittings. Mounting lugs at one end of the disk drive module cooperate with the guiding and retaining brackets to locate and retain one end of the carrier assembly, and mounting lugs on a second end of the assembly cooperate with the latching assemblies to secure and align the second end of the carrier.

The second end of the carrier assembly is brought into a final assembled position by a downward force which separates latching members of the latching assemblies whereby the mounting lugs are moved downward into engagement with cradling supports. When the mounting lugs are fully seated in the supports the latching members are spring biased back to their normal latching position to positively secure the second end of the carrier assembly. Further, the electrical connector carried by the carrier assembly is automatically connected to a related electriacl connector fitting mounted to interconnect as the mounting lugs are forced downward into the cradling supports.

To remove a disk drive module from the computer system, a handle of the carrier assembly is pulled upward whereby the mounting lugs can open the latching members to free one end of the carrier assembly from the latching assemblies. Commensurate with this upward movement all electrical connections to the disk drive module are disconnected and the module is now free to be removed from the computer system.

It is therefore an object of this invention to provide a quick release disk drive module which eliminates all manual insertions or extractions of electrical cables normally associated with installing or removing a disk drive from a computer system.

It is another object of this invention to provide a disk drive system which provide automatic electrical connections when the disk drive is installed in a computer system.

It is yet another object of this invention to provide a cooperating latching and positioning arrangement which provides quick and accurate installation of a disk drive module in a computer system and which arrangement provides automatic electrical connections to the disk drive with its installation.

It is further object of this invention to provide an arrangement for retaining a disk drive module in a computer system which is automatically mechanically and electrically releasable solely in response to manual lifting forces applied to the disk drive module.

Other objects features and advantages of this invention will be readily apparent from the following description of a preferred embodiment thereof, taen in conjunction with the accompanying drawings, although variations and modifications may be effected without departing from the spirit and scope of the novel concepts of the disclosure.

BRIEF DESCRIPTION OF THE DRAWINGS

FIG. 1 is a somewhat diagrammatic plan view of a computer system incorporating disk drive modules which are supported in a positioning and positive latching system constructed in accordance with the present invention;

FIG. 2 is an enlarged fragmentary side elevational view of the latching system shown in FIG. 1;

FIG. 3 is an enlarged vertical sectional view taken generally along the line III—III of FIG. 2;

FIG. 4 is a partial vertical sectional view taken generally along the line IV—IV of FIG. 3;

FIG. 5 is an enlarged vertical sectional view taken generally along the line V—V of FIG. 3;

FIG. 6 is an enlarged longitudinal sectional view taken generally along the line VI—VI of FIG. 2; and FIG. 7 is a vertical sectional view taken generally along the line VII—VII of FIG. 2.

DESCRIPTION OF THE PREFERRED EMBODIMENT

FIG. 1 shows a disk drive module 10 providing storage for data on a magnetic storage disk in a high capacity disk drive unit 11, such as Winchester unit or the like. The disk drive module 10 includes a disk drive carrier assembly 12 which provides a mounting hole arrangement which is capable of accepting virtually and 5¼" hard disk drive as well as some floppy disk drives. The module 10 is supported on a base unit 13 forming a fixed member in a host computer system 15. Preferably, the computer system provides support for a second disk drive module 10a (shown in phantom in FIG. 2) on a second fixed base unit 13a which is also fixedly secured within wall enclosures of the system 15.

Each carrier assembly 12 of the module 10 comprises a removable carrier frame 17 having a bottom plate 18; a pair of side walls 19 and 20; and outer end wall 21 and an inner end wall 22. The inner wall extends above adjacent side walls 19 and 20 and is provided with a carrier handle opening 23 whereby the inner end of the carrier frame may be grasped by the computer operator for installation or removal of the module from the computer system 15.

An access opening 25 is provided in the bottom plate 18, adjacent the inner side wall 22 and having a "Eurocard" type electrical connector 26 mounted to the carrier frame 17 immediately above and aligned with the access opening. A pair of clamping fixtures 27 and 28 retain the connector 26 in a precise rigid position relative to the carrier frame 17. The clamping fixtures 27 and 28 are provided with a retaining channel 30 to support opposed extended end portions 31 of the connector 26. As best seen in FIG. 5 the clamping fixtures are secured against the end wall 22 by bolts 32 threaded into nuts 33. The nuts 33 form a unified portion of retaining plates 34 and 35 which are adapted to retain the end portions 31 of the connector in the channels 30. Thus it will be seen that the clamping fixtures together with the retaining plates 34 and 35 and end wall 22 fixedly position the connector 26 in a precise orientation. As best seen in FIGS. 4 and 5 an insulating material 36 is interposed between the clamping fixtures and the end wall 22.

Connecting pins 37, extending upward from the electrical connector 26 serve as attachment means for a terminal end of ribbon cables 38 and 39 which provide electrical communication with the disk dive unit 11. Each carrier assembly is additionally provided with an inner and outer pair of mounting lugs 40 and 41. The mounting lugs are substantially identical and affixed to opposite ends of the side walls 19 and 20 by means of machine screws threaded into nuts 40a which are recessed into exterior surfaces of the mounting lugs as shown in FIG. 3.

Referring to FIG. 1 and 4 it can be seen that the fixed base units 13 and 13a are fastened down to a base plate 42 of the computer system 15 by means of screws 43. Further an interconnect board 44 is positioned between inner ends of the base units 13 and 13a and is attached thereto by means of nut and screw connections 45. Adjacent each of these points of interconnection, electrical connector fittings 50 and 51 are accurately positioned and secured by means of screws fasteners or the like.

Electrical communication lines 52 and 53 extend from the fittings 50 and 51 respectively to related computer system components as required. Herein, the lines 52 and 53 are shown as ribbon connector cables, connected to a hard disk controller board 55, although various other electrical communication arrangements may be utilized in such a system, such as printed circuits or combinations of printed circuits and short ribbon cable jumpers.

As best seen in FIGS. 2, 3, 6 and 7 each fixed base unit 13 and 13a includes a pair of guide and retaining brackets 60, at a location remote from the connector fittings, and a pair of positive latching devices 61 positioned at predetermined locations adjacent the connector fittings. The guide and retaining brackets 60 comprise upturned side portions 62 of the base units with plastic insert members 63 bolted thereon to provide a guiding and retaining function for the mounting lugs 41 of the module as will be described hereafter.

Each of the latching devices 61 includes an upturned inner side portion 65 of the base unit having an upward diverging recess 66 formed therein with a semi circulatrseat portion 67. The seat portions are adapted to cradle the mounting lugs 40. Each latching device 61, further includes a pair of latching or clamping jaws 68 pivotally supported on studs 69 affixed to the inner side portion 65 and equally spaced, horizontally from the seat portion 67. A second stud 70, horizontally spaced from each stud 69, cooperates with an arcuate guide slot 71 to limit pivotal movement of the jaws 68. Further, a torsion spring 73 is provided to urge each of the jaws 68 to an upright latching position, wherein a latching surface 74 on complementary pairs of jaws complete a substantial encirclement of the mounting lugs 40. The seat portion 67 provides the encirclement about the lower portion of the lugs 40.

Referring to FIG. 2, at the left side, the cooperating latching jaws 68, 68 are shown pivoted to a position which they assume when a mouting lug (indicated in dot dash outline at 40') is positioned directly between portions 68A, 68B of the latching jaws. Referring to the right side of FIG. 2, it will be observed that if the disk drive module 10 is lifted (by means of carrier handle opening 23, FIG. 3, in the inner end wall 22) by a distance approximately equal to the diameter of the lug 40, the disk drive module 10 will pivot about the axis of lug 41 shown at the right in FIG. 2, and will be tilted at a small acute angle relative to the horizontal. A corresponding tilted condition is shown for the disk drive module 10a by means of dot dash lines at the left in FIG. 2.

FIG. 3 is a composite partial view which shows the base plate 42 in edge elevation. The fixed base unit 13 and the side walls 19 and 20 and associated parts are shown in a sectional view which is taken generally as indicated in III—III in FIG. 2. FIG. 3 shows in a diagrammatic manner the connector 26 and the connector fitting 50 in their fully mated relationship. FIG. 3 also shows the clamping fixture 28 for the right end of fitting 26, broken away and in section to illustrate more clearly the manner in which end portion 31 of the connector 26 engages in the retaining channel 30.

FIG. 4 is a composite partial view showing a portion of interconnect board 44 and underlying parts in section FIG. 4 also shows a portion of the inner end of the disk drive module 10 and an adjacent portion of the base unit 13 in a sectional view which is taken generally as indicated at IV—IV in FIG. 3. The connector 26 and connector fitting 50 are shown diagrammatically in mating relationship. Also, in FIG. 4, side wall 19 of the carrier assembly 12 is shown partly in elevation along with its associated inner mounting lug 40. To illustrate in FIG. 4 that th carrier assembly 12 is fully seated (in correspondence with its condition in FIG. 3), the contour of the upwardly diverging recess 60 of the inner side portion 65 at the exterior of side wall 20 is shown with dotted lines. FIG. 4 where it shows side wall 19 in elevation may be regarded as omitting the associated parts of the latching device 61 since these are shown in side elevation in FIG. 2.

Nuts such as 64 (FIG. 3 at the left and FIG. 6) and N1 (FIG. 6) retain the clamping jaws 68 and the springs 73 on their respective mounting studs 69 and 70. As shown in FIG. 2 and in FIG. 3, at the left, an additional stud 75 and nut 76 carried on the upper end of the jaws 68, serve to retain an extended leg of the torsion spring 73 in a biasing orientation.

In order to assist in correlating FIGS. 1 and 2, respective individual nuts on certain of the second studs 70 have been assigned individual reference characters N1, N2, N1A and N2A in FIGS. 1 and 2. It will be observed that FIG. 2 is enlarged in comparison to FIG. 1, and that in FIG. 2 at the left only an inner portion of the base unit 13a and associated parts are shown, so that FIG. 2 is a partial enlarged somewhat diagrammatic side elevational view. For simplicity, FIG. 2 omits a showing of certain of the parts associated with interconnect board 44.

With the mounting lugs 41 at the outer end of the module supported in the brackets 60 and the mounting lugs 40 at the inner end secured in the latching devices 61 the disk drive module 10 is in a desired operating position relative to the base unit 13 and at the same time the connector fitting 50 is electrically engaged with connecting pins 37a of the electrical couxnector 26, extending downward through the access opening 25.

The Eurocard type connector in addition to transmitting control and data signals provides self diagnostic circuits to indicator lights 78 which signal that a proper electrical connection has been made, that the required voltage is available and which of the two disk drive modules has been selected for operation.

To quickly and easily remove a disk drive module 10 from a base unit 13 of the computer system 15, power is switched off and the drive unit is allowed to spin down. When the disks have stopped rotating, the computer operator grasps the carrier handle 23 and pulls upward causing the mounting lugs 40 to cam open the clamping jaws 68 as seen at the left in FIG. 2. The lugs move upward between the jaws in a pivotal motion about the mounting lugs 41 which are still retained in the brackets 60. During this pivotal motion the electrical connections are severed.

Thereafter, as the lugs 40 clear the latching devices 61, the lugs 41 are moved longitudinally along a guide surface 80 of the insert members 63 and out of the retaining pockets 81 defined therein. The entire disk drive module 10 is now free to be removed.

When installing a disk drive module 10 in the computer system 15, the operator positions the carrier assembly 12 between the pair of guide and retaining brackets 60 with the mounting lugs 41 angled downward to rest on the guide surfaces 80. Thereafter the module is moved longitudinally along the surface 80 and into engagement with the retaining pockets 81. Then the inner end of the carrier assembly is pivoted downward about the axis of the mounting lugs 41 and into contact with upper camming faces 82 of the clamping jaws 68. The mounting lugs 40 cam open the jaws 68 against the bias of the springs 73 to pass downward into the seat portions 67 of the latching devices 61. At this point the latching surfaces 74 of the jaws 68 will have enclosed about the upper portion of the lug 40 to positively secure the disk drive module 10 in a precise operating position. The camming faces 82 further insure proper orientation of the carrier assembly 12 relative to the fixed base and the connector fitting during the final pivotal movement of installation. This insures that a proper electrical connection will be made without damaging the connecting pins 37a. Thus all the required electrical transmission paths are automatically completed with installation of the disk drive module 10.

Although the teachings of my invention have herein been discussed with reference to a specific embodiment, it is to be understood that these are by way of illustration only and that variations and modifications may be effected. For example, if desired only a single disk drive module may be incorporated into the computer system, or in some applications it may be desirable to utilize three or more units. Accordingly, it should be understood that I wish to embody within the scope of the patent warranted hereon all such modifications as reasonably and properly come within the scope of my contribution to the art.

I claim as my invention:

1. In a disk drive information storage system, a fixed base unit having electrical connector fitting means secured thereon; a disk drive module for detachable coupling with said fixed based unit, said disk drive module having a disk drive unit contained therein and having electrical connector means interconnected with said disk drive unit, said disk drive module mounting said electrical connector means in fixed relation therewith for mating with the electrical connector fitting means of said base unit to complete all required electrical transmission paths to the disk drive unit, said fixed base unit and said disk drive module having cooperating means operable to position said disk drive module in a final assembled position on said fixed base unit, said electrical connector means of said disk drive module being engageable in mating relation to the electrical connector fitting means of said base unit in response to a manual loading force applied to said disk drive module for moving said disk drive module to said final assembled position on said fixed base unit.

2. In a disk drive information storage system according to claim 1, said disk drive module having a carrier handle disposed for convenient carrying of the disk drive module, and said disk drive module being removable from its final assembled position on said fixed base unit by means of a manual extraction force applied to said carrier handle.

3. In a disk drive information storage system, a fixed base unit for the transmission of signals for operating a disk drive, and a disk drive module for containing a disk drive, and for detachable coupling with said fixed base unit to form a complete disk drive system, said disk drive module having first and second mounting lug means for effecting an interengagement of the disk drive module with the fixed base unit, said fixed base unit having first retainer means for receiving said first lug means with the disk drive module in a tilted orientation while accomodating a pivotal movement of the disk drive module about said first retaining means toward a fully assembled position, and second latching type retainer means aligned with the second lug means in the tilted orientation of the disk drive module such that the second lug means are latched by the second retainer means as the disk drive module is pivoted about the first retainer means into the fully assembled position, said lug means and said retainer means being operable to secure said disk drive module in said fully assembled position solely by manipulation of said disk drive module as a whole.

4. In a disk drive information storage system according to claim 3, said lug means and said retainer means being releasable solely in response to a manual extraction force applied to said disk drive module.

5. In a disk drive information storage system according to claim 3, said disk drive module having a carrier handle disposed for convenient carrying of the disk drive module, and said lug means and said retainer means being releasable solely by a manual extraction force applied to said carrier handle.

6. In a disk drive system according to claim 3, said disk drive module and said fixed base unit having cooperating electrical connectors which are disposed for precise alignment in the tilted orientation of the disk drive module relative to said fixed base unit, said electrical connectors being mated as the disk drive module is pivoted from the tilted orientation to the fully assembled position, and said electrical connectors being releasable during removal of the disk drive module from the fixed base unit.

* * * * *